United States Patent
Masaki et al.

(10) Patent No.: US 11,313,733 B2
(45) Date of Patent: Apr. 26, 2022

(54) SENSOR AND SENSOR ASSEMBLIES FOR A THERMOMETER

(71) Applicant: Hakko Corporation, Osaka (JP)

(72) Inventors: Hiroyuki Masaki, Osaka (JP); Tomoyo Maeshima, Osaka (JP)

(73) Assignee: Hakko Corp., Osaka (JP)

( * ) Notice: Subject to any disclaimer, the term of this patent is extended or adjusted under 35 U.S.C. 154(b) by 301 days.

(21) Appl. No.: 16/419,586

(22) Filed: May 22, 2019

(65) Prior Publication Data

US 2019/0376851 A1    Dec. 12, 2019

(51) Int. Cl.
| | |
|---|---|
| *G01K 7/02* | (2021.01) |
| *B23K 3/03* | (2006.01) |
| *G01K 1/14* | (2021.01) |
| *H01L 35/30* | (2006.01) |
| *H01L 35/32* | (2006.01) |
| *G01K 1/00* | (2006.01) |
| *G01K 1/08* | (2021.01) |

(52) U.S. Cl.
CPC ............... *G01K 7/02* (2013.01); *B23K 3/033* (2013.01); *G01K 1/00* (2013.01); *G01K 1/08* (2013.01); *G01K 1/14* (2013.01); *G01K 7/023* (2013.01); *H01L 35/30* (2013.01); *H01L 35/32* (2013.01)

(58) Field of Classification Search
CPC . B23K 3/033; B23K 3/02; B23K 3/03; G01K 1/00; G01K 1/14; G01K 7/02; G01K 7/023; G01K 13/02; G01K 13/026; G01K 3/04; G01K 1/08; G01K 1/143; H01L 35/30; G05D 23/22; G01M 3/002; Y10T 137/7761; A61M 2205/15; A61M 16/201; A61M 2205/3334
See application file for complete search history.

(56) References Cited

U.S. PATENT DOCUMENTS

| | | | | |
|---|---|---|---|---|
| 2,735,882 | A * | 2/1956 | Farley | G01K 1/143 374/E1.019 |
| 3,040,579 | A * | 6/1962 | Taylor | G01K 5/32 374/141 |
| 3,886,798 | A * | 6/1975 | Fortune | G01K 7/00 136/232 |
| 3,891,466 | A * | 6/1975 | Erickson | H01F 13/003 136/200 |
| 4,861,169 | A * | 8/1989 | Yoshimura | G01K 7/04 374/179 |
| 5,151,574 | A * | 9/1992 | Urban | B23K 3/033 219/241 |

(Continued)

FOREIGN PATENT DOCUMENTS

| | | | | |
|---|---|---|---|---|
| CN | 111477366 B | * | 11/2021 | ......... G01F 23/0007 |
| ES | 2781479 T3 | * | 9/2020 | ............... G01K 7/02 |
| JP | 2016065755 A | * | 4/2016 | |

*Primary Examiner* — Gail Kaplan Verbitsky
(74) *Attorney, Agent, or Firm* — David B. Abel

(57) ABSTRACT

The invention is directed to embodiments of a temperature sensor for use with a temperature measuring device, for example a digital thermometer. The temperature sensor includes at least two and preferably three wires joined at a thermocouple. The temperature sensor is designed to be mounted on terminals of the digital thermometer sensor to allow precise temperature measurements for a thermal device, for example a soldering tool or de-soldering tool.

8 Claims, 17 Drawing Sheets

(56) References Cited

U.S. PATENT DOCUMENTS

| | | | | |
|---|---|---|---|---|
| 5,837,973 A * | 11/1998 | Tamura | ................ | H05B 1/0213 |
| | | | | 219/241 |
| 6,087,631 A * | 7/2000 | Miyazaki | ............... | B23K 3/033 |
| | | | | 219/229 |
| 6,257,758 B1 * | 7/2001 | Culbertson | ............ | G01K 1/143 |
| | | | | 374/120 |
| 8,475,037 B2 * | 7/2013 | Takigawa | ................ | G01K 13/08 |
| | | | | 374/153 |
| 9,700,951 B2 * | 7/2017 | Matsuzaki | ............... | B23K 3/02 |
| 2002/0126734 A1 * | 9/2002 | Murtishaw | ............... | G01K 7/04 |
| | | | | 374/179 |
| 2013/0208759 A1 * | 8/2013 | Danley | ................. | G01K 17/08 |
| | | | | 374/10 |
| 2014/0105248 A1 * | 4/2014 | Daily | ....................... | G01K 1/14 |
| | | | | 374/179 |
| 2019/0041308 A1 * | 2/2019 | Schryver | .............. | A01N 1/0257 |
| 2021/0123813 A1 * | 4/2021 | Yang | ........................ | G01K 1/16 |
| 2021/0220832 A1 * | 7/2021 | Schryver | ................... | B01L 7/00 |

* cited by examiner

SENSOR AND SENSOR ASSEMBLIES FOR A THERMOMETER

FIELD OF THE INVENTION

The present invention is related to a temperature sensor having a thermocouple for use with a temperature measuring device, for example a digital thermometer assembly, for measuring the temperature of thermal tools including for example soldering devices, de-soldering devices and hot air blowers.

BACKGROUND OF THE INVENTION

The operating temperature of thermal tools may affect the electronic products being assembled using the thermal tool. The operating temperature of the thermal tool, for example a soldering device, is sometimes measured before a soldering activity, to confirm that the operating temperature corresponds with the desired or set point temperature the operator sets using a control station for the particular soldering activity. There are many temperature measuring devices to measure temperature of thermal tools, and some of the temperature measuring devices are designed to use replaceable sensors. An example of a temperature measuring device is a HAKKO™ FG-100 Thermometer available from American Hakko Corporation of Sylmar, Calif. The FG-100 Thermometer is configured with three terminals to mount a thermocouple temperature sensor assembly. An example of a thermocouple temperature sensor assembly is disclosed in JP H1-288742, which describes and depicts a thermocouple that is reinforced by a metal tube enclosing a contact point. The tip of a soldering device or soldering tool may be placed on the metal tube and the temperature is measured based on a voltage potential difference of the thermocouple at the contact point. When the tip of the soldering device is placed on the metal tube, solder is supplied to the tip. As a result, solder is melted onto the metal tube and the gap between the metal tube and the tip is filled with solder. The heat of the tip transfers to the thermocouple at the contact point through the solder, and not through air, so that the temperature of the tip of the soldering device may be measured.

BRIEF DESCRIPTION OF THE INVENTION

When measuring the temperature of a soldering or de-soldering device, solder often attaches to the conductors of the thermocouple sensor assembly. If the user uses the same thermocouple sensor assembly multiple times, the solder erodes the conductors and the conductors may break or change their conductivity, introducing an error into the temperature measurement. The accuracy of measuring the temperature of the soldering device thus degrades over time and use. The purpose of this invention is to provide a thermocouple temperature sensor assembly that is less susceptible to corrosion or degradation from the solder and which allows a user to measure temperatures precisely over a long period of time and multiple uses.

DETAILED DESCRIPTION OF THE INVENTION

Figure 1:
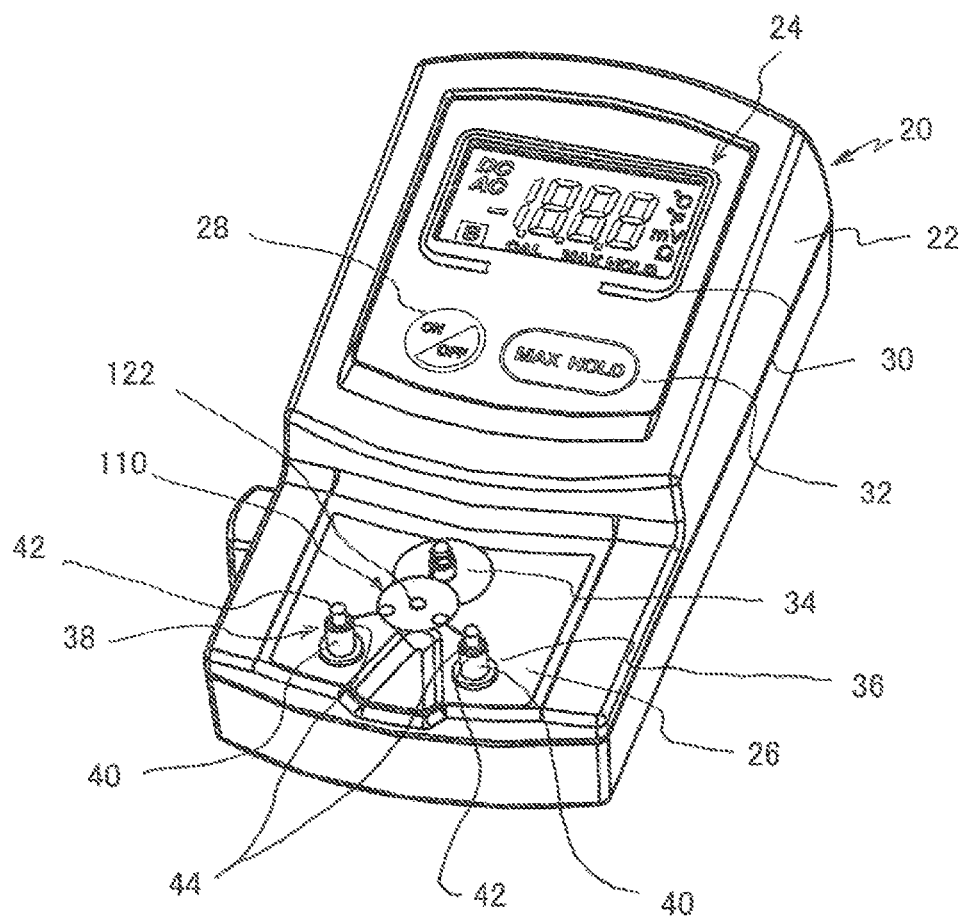
FIG. 1 depicts a perspective view of a temperature measuring device having a removable and replaceable thermocouple sensor assembly of a first embodiment of the present invention.

FIG. 1 is a perspective view of an exemplary known temperature measuring device, more specifically a digital thermometer 20, having a removable and replaceable thermocouple sensor 110 of a first embodiment of the present invention. The thermometer 20 has a housing 22, a user interface 24 and a sensor mounting assembly 26. The user interface 24 includes an on/off control button 28 and a display 30, for example a light emitting diode (LED) or liquid crystal display (LCD). The user interface 24 may also include an indicator 32 to show a measured maximum temperature on a display or a signal to alert a user to a specific condition, for example a timed period for a temperature measurement. The thermometer 20 may be operated by a user to check the temperature measured at the sensor 110, with the temperature measurement being displayed on the display 30.

The sensor mounting assembly 26 includes three posts, 34, 36 and 38, on which the sensor 110 is mounted. The posts 34, 36 and 38 of the mounting assembly 26 may be positioned at the intersecting points of a triangle. Each of the posts 34, 36 and 38 include a lower base portion 40 and a top contact 42, with the lower base portion 40 preferably having a larger cross-sectional diameter that the top contact 42. The top of the lower base portion 40 forms a shoulder 44 atop of which the sensor 110 can be positioned. The lower base portion 40 is an insulator surrounding a cylindrical conductor extending from the top contact 42 into the housing 22. The post 34 at the apex of the triangle is movable and biased by a spring assembly within the housing to allow a user to securely mount a sensor 110 on the posts 34, 36 and 38. The posts 36 and 38 at the right and left ends of the base of the triangle are preferably fixed in position on the housing 22. The posts 36 and 38 are used as the measuring terminals providing power to the sensor 110 and receiving the voltage signal from the thermocouple of the sensor 110. The post 34 at the apex of the triangle is moveable and spring biased so that a user may first position a sensor 110 on the posts 36 and 38 and then mount the sensor 110 on the post 34 which holds the sensor 110 in place because of the spring bias force on the post 34.

The housing 22 encloses the electrical circuitry of the thermometer 20, including the spring for biasing the post 34, a battery power source, control circuit and an arithmetic circuit for calculating temperature at the thermocouple of the sensor 110 based on the voltage signal from the right post 36 and left post 38. The arithmetic circuit converts measured voltage potential difference into temperature data and outputs the temperature data through the control circuit to the display 30. Right post 36 and left post 38 are used as voltage measuring terminals.

Figure 2:
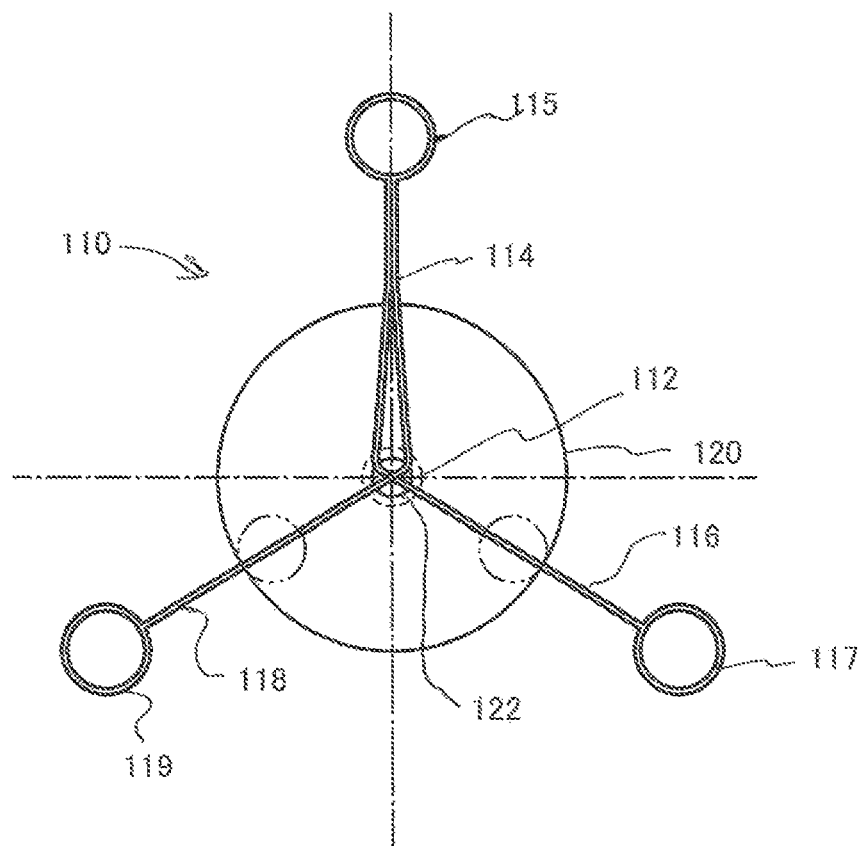
FIG. 2 is a depiction of the replaceable thermocouple sensor assembly of the first embodiment of the present invention.

FIG. 2 shows bottom view of the sensor 110 of the first embodiment of the present invention. The sensor 110 includes a thermocouple 112, a holding wire 114 and a pair of signal wires 116 and 118. The holding wire 114 includes an attaching ring 115 which may be attached to the mounting post 34, and signal wires 116 and 118 include attaching rings 117 and 119, respectively, which may be attached to the posts 36 and 38 of FIG. 1. The sensor 110 also includes a covering member 120 and a contact disk 122.

The thermocouple 112 is formed at the intersection of the signal wires 116 and 118 and a contact disk 122 which is used to measure temperature. The signal wires 116 and 118 are made of different kinds of metals. One signal wire is preferably be Alumel, and the other is preferably Chromel. The signal wires 116 and 118 are bent at the middle of the triangle defined by the attaching rings 115, 117 and 119. The signal wires 116 and 118 as well as the holding wire 114 are all conductors. The ends of the signal wires 116 and 118 form the attaching rings 115 and 117, respectively, that provide electrical contact with the top contacts 42 of posts 36 and 38, respectively, which are positioned on the housing 22 of the thermometer 20 of FIG. 1. The holding wire 114 also forms an attaching ring 115 which is to be mounted on the top contact 42 of the post 34 positioned at the apex of the triangle shape sensor mounting portion of the thermometer 20 of FIG. 1. The signal wires 116 and 118 are crossed at the center of the triangle shaped sensor 110 with the crossed intersection of the signal wires 116 and 118 operating with the contact disk 122 to conduct heat to the thermocouple 112.

Figure 3:
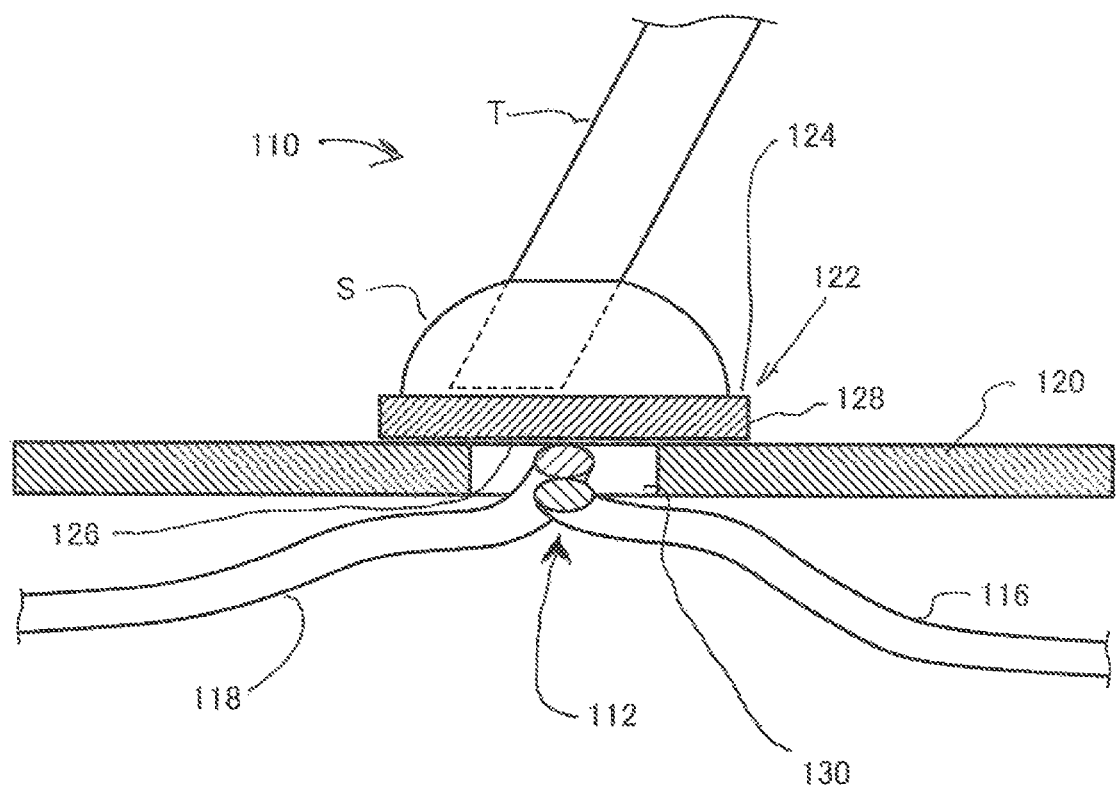
FIG. 3 is a side partial cross-sectional view of the thermocouple portion of the replaceable thermocouple sensor assembly and a tip of a soldering device.

FIG. 3 is an enlarged side partial cross-sectional view at the thermocouple 112 portion of the replaceable sensor 110. As depicted in FIG. 3, the contact disk 122 is positioned on the thermocouple 112 contact formed by the intersection of the signal wires 116 and 118. The contact disk 122 is a metallic disk formed from a material having a high heat conductivity such as copper or iron. The contact disk 122 includes an upper surface 124, a lower surface 126 and a peripheral diameter rim 128. The contact disk 122 has a diameter sufficient to allow the contact disk 122 to completely cover an orifice or central opening 130 in the covering member 120. The thermocouple 112 contact formed by the intersection of the signal wires 116 and 118 is pressed through the central opening 130 in the covering member 120 so as to contact the lower surface 126 of the contact disk 122.

The contact disk 122 covers the crossed part of signal wires 116 and 118 that form the thermocouple 112. The upper surface 124 of the contact disk 122 is surface-treated to improve the solder wettability such as by tin plating, and the peripheral diameter rim 128 is not surface-treated. The wettability of peripheral diameter rim 128 is lower than that of the upper surface 124. The lower surface 126 of the contact disk 122 may not be surface treated, however, the lower surface 126 may be surface-treated to improve pressure bonding of the thermocouple 112 to the lower surface 126 of the contact disk 122.

The covering member 120 is positioned atop the holding wire 114 and signal wires 116 and 118. The covering member 120 may be a sheet or disk made of electrically non-conductive material. The covering member 120 may preferably be a circular or triangular polyimide film. The covering member 120 is located between the contact 122 and the conductors of the holding wire 114 and signal wires 116 and 118. The covering member 120 and the contact disk 122 are arranged concentrically. The covering member 120 preferably covers about one-half of the holding wire 114 and the signal wires 116 and 118. The attaching rings 115, 117 and 119 at the ends of the holding wire 114 and signal wires 116 and 118 respectively are positioned outside of the circumference or periphery of the covering member 120.

The covering member 120 includes the central opening 130 having a diameter less than the diameter of the contact disk 122, whereby the contact disk 122 overlaps a ring shaped portion of the covering member 120 around the central opening 130, as well as portions of the holding wire 114 and signal wires 116 and 118 that are below the covering member 120. The overlapped part includes the inner peripheral part forming the circular central opening 130 in the covering member 120. The central opening 130 and the contact disk 122 are arranged concentrically. The diameter of the central opening 130 is smaller than the diameter of the contact disk 122, whereby the central opening 130 is covered by the contact disk 122 entirely.

The central opening 130 is provided to allow a connection between the lower surface 126 of the contact disk 122 with crossed intersection of signal wires 116 and 118. The crossed intersection of signal wires 116 and 118 forms a thermocouple that is press fitted against the lower surface 126 of the contact disk 122 within the central opening 130 of the covering member 120. As a result, the contact disk 122 is securely fixed onto the thermocouple formed by the conductors of signal wires 116 and 118.

The sensor 110 is a separate assembly that is removably attached to the thermometer 20 temperature measuring device as depicted in FIG. 1. When the sensor 110 is to be attached to the thermometer 20 temperature measuring device, the sensor 110 is positioned to allow the attaching rings 117 and 119 to be mounted on the posts 36 and 38, respectively. The signal wires 116 and 118 are sufficiently flexible to allow their being spread apart at the rings 117 and 119 to place around the posts 36 and 38. The mounting post 34 is spring biased but moveable toward the center between posts 36 and 38 to allow the user to attach the ring 115 of the holding wire 114 to the mounting post 34 on the thermometer 20 temperature measuring device without pulling the sensor 110. After the ring 115 is mounted on the mounting post 34, the biasing spring inside of the housing 22 moves the mounting post 34 outward, providing a proper amount of tension force on the signal wires 116 and 118 as well as the holding wire 114 suspending the sensor 110 on the thermometer 20.

When each of the attaching rings 115, 117 and 119 are mounted on the respective posts 34, 36, 38, the attaching rings 115, 117 and 119 are positioned on the shoulder 44 the lower base portion 40 of each post 34, 36 and 38, so that there is a space or gap below the sensor 110 and above the case 22 of the thermometer 20. The space below the sensor 110 is an air space that prevents heat from transferring from the sensor 110 to the thermometer 20 that may affect the temperature measured at the thermocouple 112.

After the sensor 110 is attached to the thermometer 20, an object to be measured is pressed against the contact disk 122 of the sensor 110. The sensor 110 is attached to the thermometer 20 with moderate tension. Even when the object to be measured is pressed against the contact disk 122 of the sensor 110, the signal wires 116 and 118 and the holding wire 114 of the sensor 110 do not bend a lot.

FIG. 3 depicts a tip (T), such as for example a soldering tip of a soldering device, as the object to be measured for its temperature. When the tip is pressed against the upper surface 124 of the contact disk 122, solder (S) is supplied to the tip. As a result, the upper surface 124 of the contact disk 122 and the area surrounding of tip is occupied by liquid solder. The heat of the tip, and thus its temperature transfers to the contact disk 122 and the thermocouple 112 at the intersection of the conductors of signal wires 116 and 118 without an air gap. The voltage potential difference between the two different conductor materials forming the signal wires 116 and 118 and thus the thermocouple 112 is directly dependent upon the tip temperature. The voltage potential difference of the thermocouple 112 is measured by the arithmetic circuit in the housing 22 of the thermometer 20. The arithmetic circuit converts measured voltage potential difference into temperature data. The display 24 shows the measured temperature digitally. The user can then determine if the measured temperature is correct for the particular soldering tip and the soldering device.

Solder melted around the tip spreads on the upper side 124 of the contact disk 122 which has made to have high solder wettability, and does not flow to the peripheral rim 128 which has low wettability. The peripheral rim 128 thus prevents solder flowing down to the covering member 120. However, if solder is supplied excessively or if the tip is displaced radially outward while engaging or disengaging from the contact disk 122, some solder may overflow from the upper surface 124 of the contact disk 122. The covering member 120 acts to catch and contained any overflowing melted solder. Therefore, melted solder does not reach or attach to the signal wires 116 and 118 which are protected under the covering member 120. There is little risk that solder can flow to the signal wires 116 and 118 through the intersection between the lower surface 126 of the contact disk 122 and the covering member 120 and across the central opening 130. The diameter of the central opening 130 is smaller than that of the contact disk 122. The top or upper surface of the covering member 130 and the lower surface 126 of the contact disk 122 form a boundary.

The covering member 120 is in contact with the lower surface 126 of the contact disk 122, and thus heat from the soldering tip may be transferred to the covering member 120 by the contact disk 122. Therefore, the material of the covering member 120 is selected based upon the maximum operating temperatures of the thermal devices that may be tested. The physical strength of the material for the covering member 120 is not critical because the covering member 120 is not secured to the mounting posts 34, 36 and 38. Even when the sensor 110 is attached to the mounting posts 34, 36 and 38, there is no stress or strain on the covering member 120 even during a measurement operation.

Tension or tensile strain is applied to the holding wire 114 and the signal wires 116 and 118 when the user attaches the sensor 110 to the thermometer 20. The bent part of the signal wires 116 and 118 is fragile. The position of the bent part of the signal wires 116 and 118 is decided taking into account the risk that one of the signal wires 116 and 118 breaks by tension. The bent part of the signal wires 116 and 118 is located between the crossed part of the signal wires 116 and 118 and the attach ring 115 at the end of the holding wire 114. The two holding wires 114 extend between the crossed parts of the signal wires 116 and 118 and the attach ring 115 so that the tension applied to the sensor 110 is shared by the two holding wires 114. Any force applied to the bent parts of the signal wires 116 and 118 is shared, whereby there is little risk of breaking the signal wires 116 and 118 at their bent section.

The location of the thermocouple at the point where the signal wires 116 and 118 intersect at the center of the sensor 110 is pressed against the lower surface 126 of the contact disk 122 so that there may be residual stress within the signal wires 116 and 118 at the thermocouple 112 or around it. Though thermocouple 112 is fragile, the signal wires 116 and 118 are extended straight toward their rings 117 and 119, respectively. Residual stress other than press-contact process stress does not apply to the signal wires 116 and 118. The signal wires 116 and 118 have enough tension strength to endure tension when attaching and using the sensor 110.

The covering member 120 may be formed from a high temperature-resisting resin material, for example Polyimide film. Alternatively, the covering member 120 may be formed from a non-conductive ceramic or non-conductive metal. The covering member 120 is made of a non-conductive material so that the covering member 120 does not affect voltage potential difference between the signal wires 116 and 118 of the sensor 120, and thus the non-conductive material of the covering member 120 contributes to measuring temperature accurately. Preferably, the covering member 120 is made of a material which has low thermal conductivity and low a heat transfer coefficient, whereby less heat transfers to the covering member 120, and temperature of the object to be tested can be measured accurately.

The covering member 120 may be formed into a disk shape with a central opening 130. Alternatively, the covering member 120 may be a triangle, a square or other shape which can keep the signal wires 116 and 118 and the holding wire 114 away from solder. The thermocouple 112 as depicted in FIG. 2 has a Y-shape. The thermocouple 112 may have other shapes. For example, a thermocouple having an X-shape may be attached to a thermometer having four mounting posts which are placed at the corners of a square.

Thus, the shape of the thermocouple 112 may be decided depending on the structure of the thermometer 20 or other measuring device. The contact disk 122 is preferably a circular disk, however it may have other shapes such as a triangle, square, polygon or ellipse.

Figure 4:
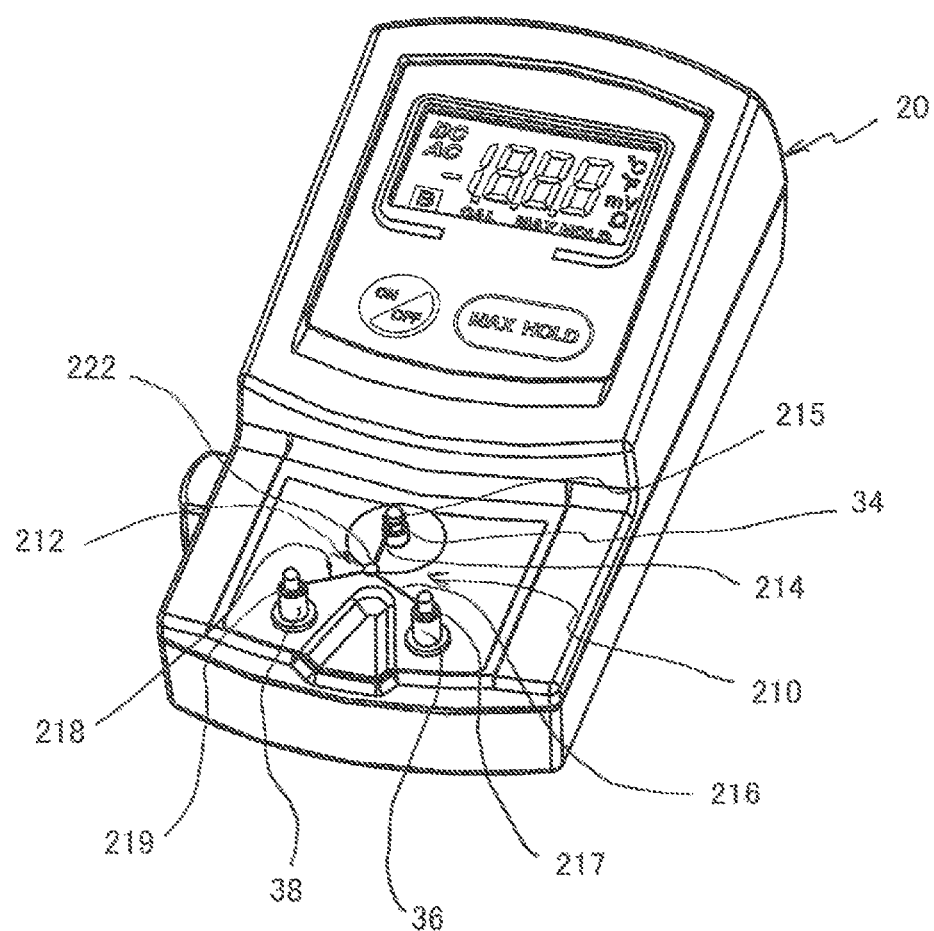
FIG. 4 depicts a perspective view of a temperature measuring device having a removable and replaceable thermocouple sensor assembly of a second embodiment of the present invention.

FIG. 4 depicts a perspective view of the temperature measuring device or thermometer 20 having a removable and replaceable thermocouple sensor 210 of a second embodiment of the present invention. The sensor 210 has a structure similar to that of the first embodiment, however there is no covering member 120 as in FIGS. 2 and 3. Instead, the sensor 210 has a thermocouple 212 formed at the intersection of signal wires 216 and 218, and a holding wire 214, as well as attaching rings 215, 217 and 219 to allow the sensor 210 to be mounted on the posts 34, 36 and 38 of the thermometer 20. The contact disk 222 has an upper surface plated so as to have a high solder wettability and a peripheral rim and lower surface having a low solder wettability. If the object to be tested is fine or small, less solder needs to be supplied to the object and the contact disk 222, and the supplied solder stays on the upper surface of the contact disk 222. Even if an excessive amount of solder supplied, the low wettability of the peripheral rim of the contact disk 222 helps solder stay on the upper surface.

Figure 5:
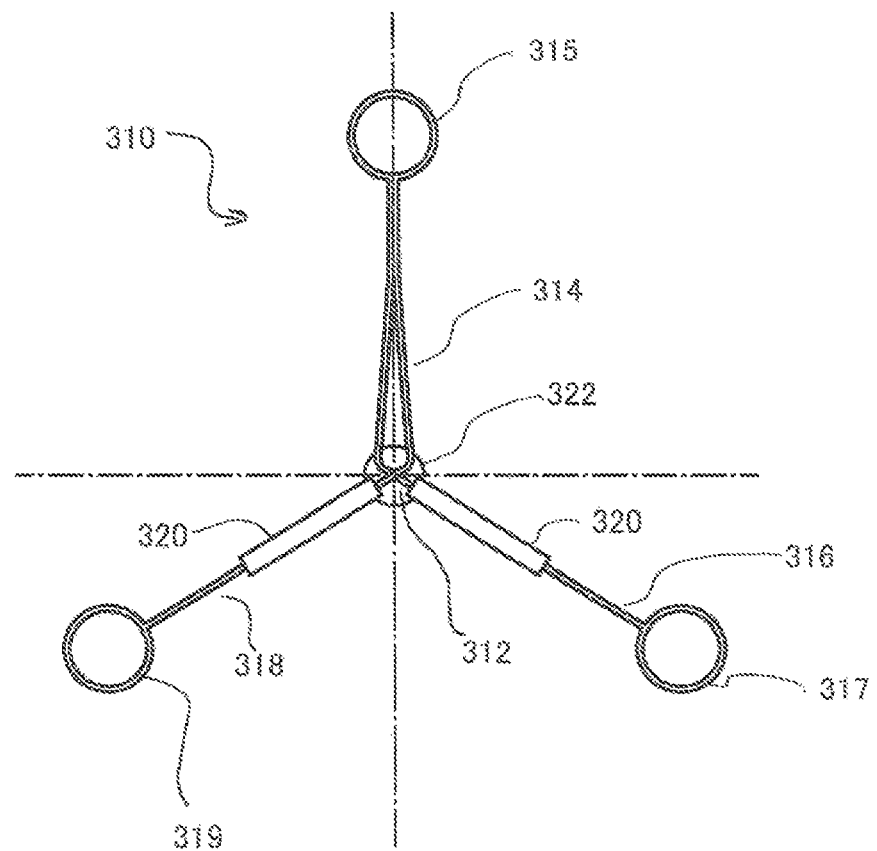
FIG. 5 is a depiction of a replaceable thermocouple sensor assembly of a third embodiment of the present invention.

FIG. 5 is a bottom view of a third alternative embodiment of a sensor 310 according to the present invention. The sensor 310 of the third embodiment is similar to the sensor 210 of the second embodiment in that it has a thermocouple 312 formed at the intersection of signal wires 316 and 318, and a holding wire 314, as well as mounting rings 315, 317 and 319 to allow the sensor 310 to be mounted on the posts 34, 36 and 38 of the thermometer 20. The thermocouple 312 and central portions of the holding wire 314, signal wire 316 and signal wire 318 are covered by a contact disk 322. The contact disk 322 has an upper surface plated so as to have a high solder wettability and a peripheral rim and lower surface having a low solder wettability. Portions or all of the signal wire 316 and signal wire 318 have covering members 320 which are made from heat-resisting paint, high temperature resin or ceramic. The covering member 120 in FIG. 1 and the covering members 320 in FIG. 5 have the same function. The covering members 320 are non-conductive and have resistance to heat of 200° C. or higher. The covering members 320 are formed from a material that is resistant to solder corrosion. The covering members 320 at least partly cover the signal wires 316 and 318 around the contact disk 322 and the thermocouple 312. The covering members 320 cover part of the signal wires 316 and 318 so that solder overflowing from the contact disk 322 attaches to the covering members 320. The covering members 320 have good corrosion resistance, whereby the signal wires 316 and 318 covered by the covering members 320 are protected from solder. If a paint or resin is used to form the covering members 320, and it does not hinder pressing the thermocouple 312 to the lower surface of the contact disk 322, the paint or resin may be applied over all of the surface of the signal wires 316 and 318 except at their attaching rings 317 and 319. The covering members 320 may be a non-conductive tube instead of paint or resin. In this case, the signal wires 316 and 318 are inserted into tubes before the attaching rings 317 and 319 are formed.

Figure 6:
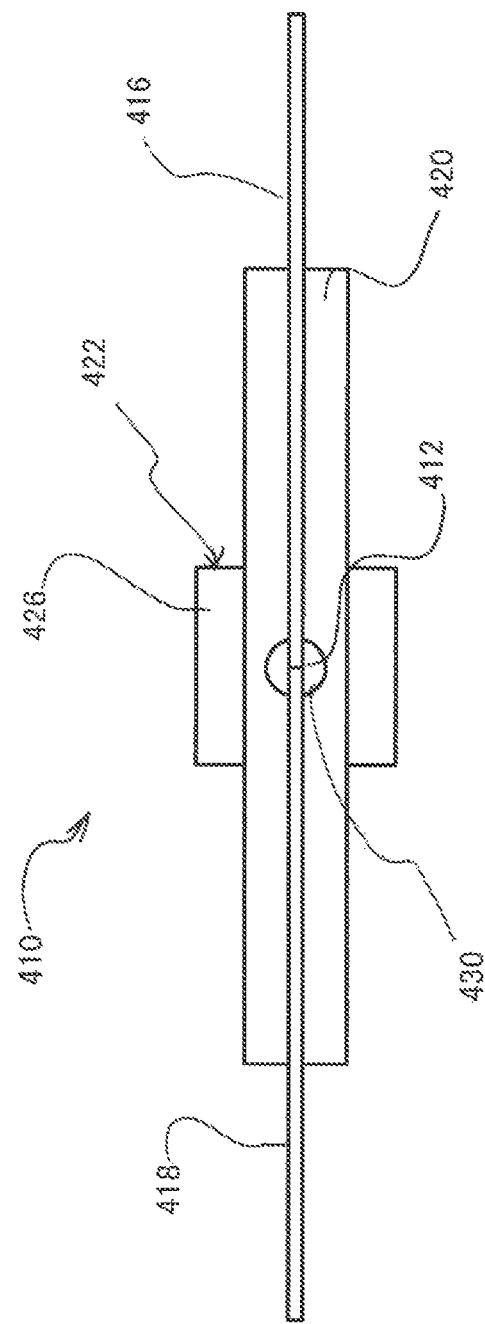
FIG. 6 is a bottom view of a replaceable thermocouple sensor assembly of fourth embodiment of the present invention.

FIG. 6 is a bottom view of a fourth embodiment of the replaceable thermocouple sensor 410 of the present invention. The sensor 410 has a thermocouple 412 and a covering member 420 having a central opening 430. The thermocouple 412 is at the intersection of two conductor signal wires 416 and 418, the sensor 410 includes a contact plate 422. The contact plate 422 is depicted as having a square shape although the contact plate 422 may preferably be rectangular. The contact plate 422 completely covers central opening 430 of the covering member 420, and extends over the portion of the covering member 420 surrounding the central opening 430. The signal wires 416 and 418 in this embodiment are single wires depicted extending in a straight line, although the wires are bendable.

The central ends of each of the signal wires 416 and 418 contact each other at the thermocouple 412 located at the middle of the sensor 410, and the thermocouple 412 is in contact with a lower surface 426 of the contact plate 422 within the central opening 430 of the covering member 420. The signal wires 416 and 418 of the sensor 410 of FIG. 6 may or may not include attaching rings at the peripheral ends as in the sensor embodiments described above. Instead, the peripheral ends of the signal wires 416 and 418 as depicted in FIG. 6 may be wrapped around the posts 36 and 38 of the measuring terminals on the thermometer 20 of FIG. 1. The covering member 420 is formed as a rectangle sheet from a resin, high temperature plastic, ceramic or non-conductive metal. The covering member 420 preferably covers about one-half of the length of the signal wires 416 and 418, although the covering member 420 may have a width about ten-percent wider than the width of the contact plate 422, or the covering member 420 may extend out to the portion of the signal wires 416 and 418 that wrap around the posts 36 and 38 of the thermometer 20. When the thermocouple 412 is pressed against the lower surface 426 of the contact plate 422 through the central opening 430 of the covering member 420, the covering member 420 and contact plate 422 are affixed to the thermocouple 412 and the signal wires 416 and 418.

Figure 7:
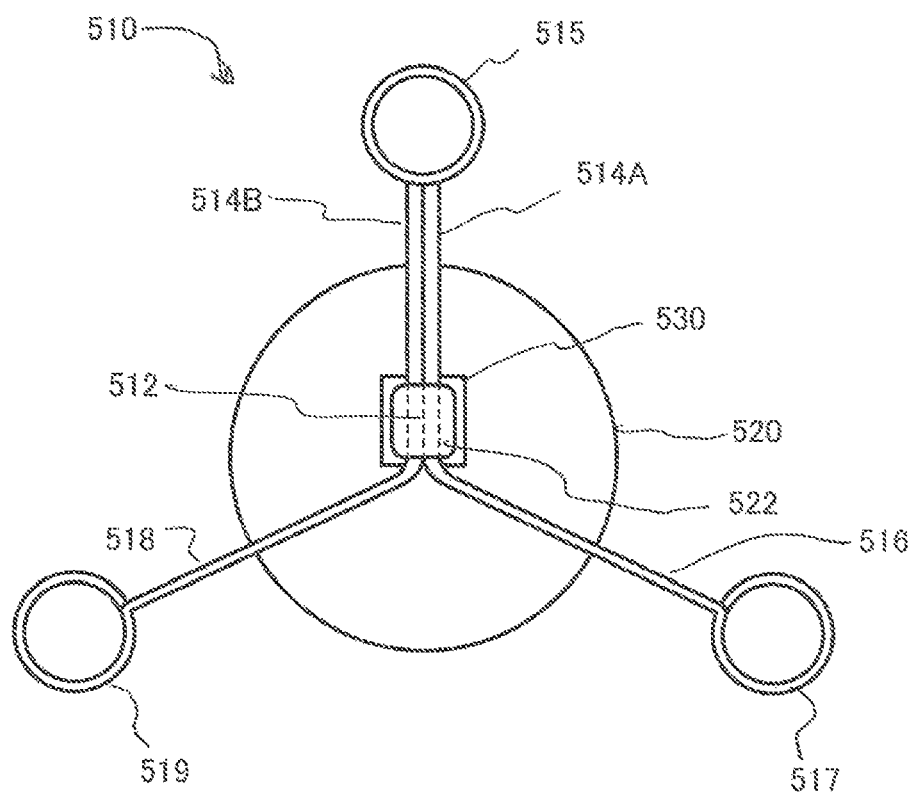
FIG. 7 is a depiction of a replaceable thermocouple sensor assembly of a fifth embodiment of the present invention.

FIG. 7 is a depiction of a fifth embodiment of the replaceable thermocouple sensor 510 assembly of the present invention. The sensor 510 includes a thermocouple 512 at the intersection of signal wires 516 and 518. The central portion of the sensor 510 includes a covering member 520 having a central opening 530. The signal wire 516 includes an attaching ring 517 and the signal wire 518 includes an attaching ring 519. The signal wires 516 and 518 are inserted into a contact sleeve 522 proximate the center of the sensor 510. The contact sleeve 522 encloses the thermocouple 512. In the embodiment of FIG. 7, the contact sleeve 522 is hollow flattened tube. The contact sleeve 522 has three primary functions, providing a high heat transfer efficiency to the thermocouple 512, protecting the thermocouple 512 from the corrosive effects of the solder, and pressing the respective conductors of signal wires 516 and 518 together to form the contact of the thermocouple 512.

The signal wires 516 and 518 are not crossed at the center of the sensor 510, unlike the configuration of the sensor 110 of the first embodiment. Instead, the signal wires 516 and 518 have an approximately 120 degree bend just before the contact sleeve 522, and the signal wires 516 and 518 extend in parallel through the contact sleeve 522 to an attaching ring 515. The portion of the signal wires 516 and 518 that extend from the contact sleeve 522 to the mounting ring 515 are effectively holding wires identified as 514A and 514B, respectively. The flattened tube-shaped contact sleeve 522 covers the signal wires 516 and 518 as they transition to holding wires 514A and 514B, respectively. The contact sleeve 522 presses the signal wires 516 and 518 together and the thermocouple 512 is formed within the contact sleeve 522. During assembly, the contact sleeve 522 is pressed in its central portion to clamp onto the signal wires 516 and 518. This process results in the ends of the contact sleeve being elevated as compared to the central portion and liquid solder will be maintained in the central portion. The top or upper surface of the contact sleeve 522 is coated to have a high solder wettability. The remainder of the contact sleeve 512, including the end faces, edges, underside and interior surfaces preferably have low solder wettability. The high solder wettability only on the upper surface of the contact sleeve tends to maintain liquid solder only on the upper surface of the contact sleeve 522 during a temperature measuring function. The covering member 520 of the sensor 510 has central opening 530 shaped to closely approximate the outer dimensions of the contact sleeve 522, whereby any excess solder spills over onto the covering member 520 instead of adhering to the signal wires 516, 518. Therefore, the covering member 520 covers the signal wires 516, 518 extending from the thermocouple 512 as well as the holding wires 514A and 514B. The covering member 520 is preferably attached to the signal wires 516, 518 as well as the holding wires 514A and 514B using an adhesive.

When the sensor 510 is placed on the thermometer 20 (FIG. 1) and used for measuring the tip temperature of a heating device such as a soldering iron, the tip of the soldering iron is pressed against the upper surface of the contact sleeve 522 and solder is supplied to the tip of the soldering device as well as the upper surface of the contact sleeve 522. The ends and sides or edges of the contact sleeve 522 have a low solder wettability so that liquid solder does not flow over the ends of the contact sleeve 522 into contact with the signal wires 516 and 518, and only the upper surface of the covering sleeve is coated with solder. If both ends of contact sleeve 522 prevent solder from flowing over the ends, the entire outer periphery of the contact sleeve 522 may be coated to have a high solder wettability. Because the central opening 530 of the covering member 520 has a shape closely approximating the periphery of the contact sleeve 522, there is little risk that the tip of the soldering device may be accidentally pushed past the contact sleeve 522 and into contact with the signal wires 516 and 518. Alternatively, both ends of the contact sleeve 522 may be formed to have a low solder wettability to prevent solder from flowing over the ends of the contact sleeve 522, in which case the entire length of the contact sleeve 522 may be pressed to squeeze the signal wires 516 and 518.

Figure 8:
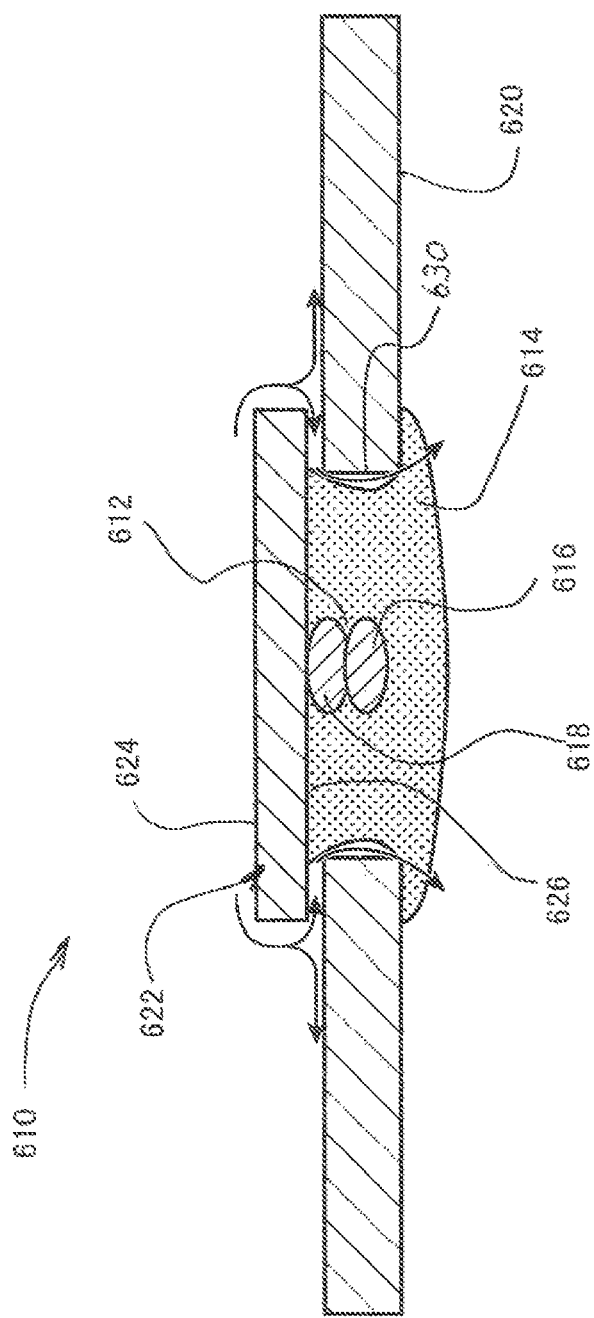
FIG. 8 is a side partial cross-sectional view of the thermocouple portion of the replaceable thermocouple sensor assembly of the sixth embodiment of the present invention.

FIG. 8 is a side partial cross-sectional view of the thermocouple portion of a sixth embodiment of a replaceable thermocouple sensor 610 of the present invention. The sensor 610 has a thermocouple 612 embedded within a resin matrix 614 protecting the thermocouple 612. The sensor 610 includes the signal wires 616 and 618 as well as the covering member 620 having a central opening 630. The sensor 610 also includes the contact disk 622 having an upper surface 624 and a lower surface 626. The thermocouple 612 is pressed against and in intimate contact with the lower surface 626 of the contact disk 622.

The resin matrix 614 protects the thermocouple 612 and signal wires 616 and 618 from liquid solder which may flow around and under to the lower surface 626 of the contact disk 622 member. The resin matrix 614 protecting the thermocouple 612 is made from a non-conductive heat-resisting paint, for example a resin such as silicone having resistance to heat of 200° C. or higher. The resin matrix 614 protecting the thermocouple 612 coats the signal wires 616 and 618 in an area sufficient to protect them across the entire central opening 630 of the covering member 620. As depicted in FIG. 8, the resin matrix 614 protecting the thermocouple 612 may raise the lower surface 626 of the contact disk 622 above the upper surface of the of the contact member 620. Accordingly, it may be possible for liquid solder to flow between the lower surface 626 of the contact disk 622 and the upper surface of the of the contact member 620 through gap as depicted by the arrows in FIG. 8. Solder flowing into the gap touches the resin matrix 614 protecting the thermocouple 612 and is prevented from reaching the thermocouple 612 and signal wires 616 and 618.

Figure 9:
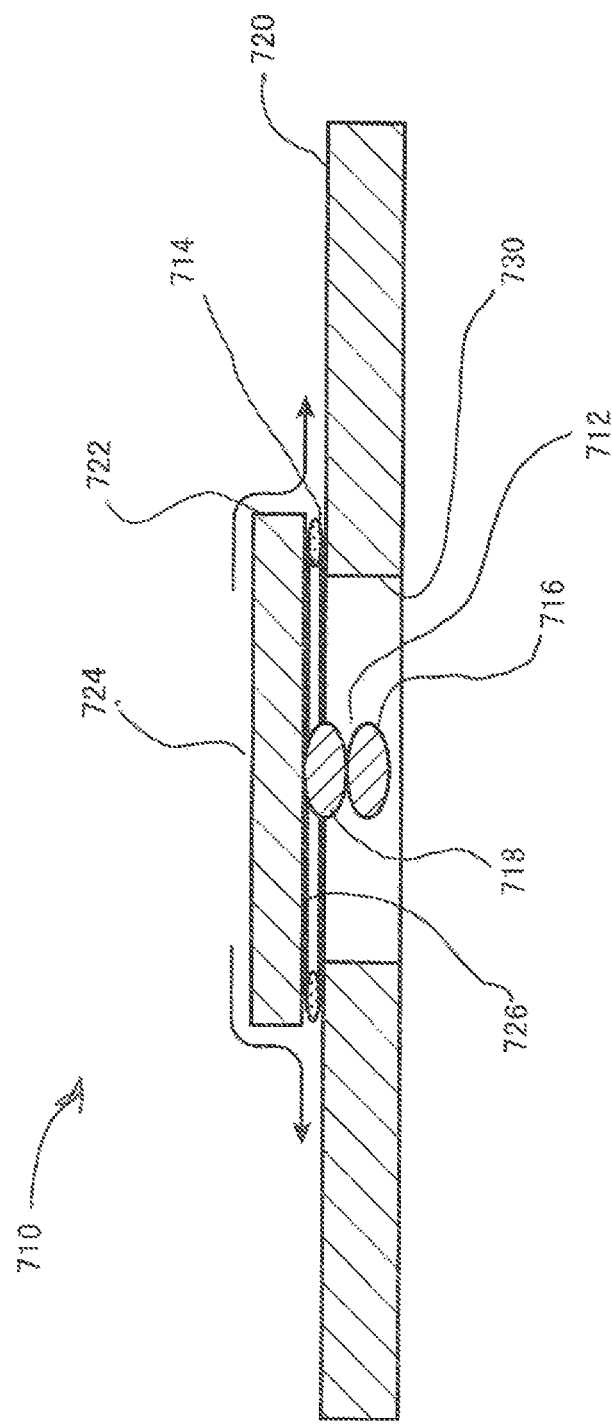
FIG. 9 is a side partial cross-sectional view of the thermocouple portion of a replaceable thermocouple sensor assembly of a seventh embodiment of the present invention.

FIG. 9 is a side partial cross-sectional view of a seventh embodiment of the thermocouple portion of a replaceable thermocouple sensor 710 of present invention. The sensor 710 includes a thermocouple 712 and a protecting ring 714. The sensor 710 also includes the signal wires 716 and 718 as well as the covering member 720 having a central opening 730. The sensor 710 also includes the contact disk 722 having an upper surface 724 and a lower surface 726. The thermocouple 712 is pressed against and in intimate contact with the lower surface 726 of the contact disk 722. The protecting ring 714 is formed between the lower surface 726 of the contact disk 722 and the upper surface of the covering member 720. The protecting ring 714 is positioned within the area where the contact disk 722 overlaps the covering member 720. The protecting ring 714 fills the gap between the lower surface 726 of the contact disk 722 and the upper surface of the covering member 720. The protecting ring 714 may be made from a resin, non-conductive heat-resisting paint, high temperature thermoplastic, ceramic or non-conductive metal. Alternatively, protecting ring 714 may be made from a non-conductive adhesive. Because of the protecting ring 714, any liquid solder flowing off of the contact disk 722 flows outward across the covering member 720 as illustrated by the arrows in FIG. 9. The protecting ring 714 diverts solder from coming into contact with the thermocouple 712 and the signal wires 716 and 718.

Figure 10:
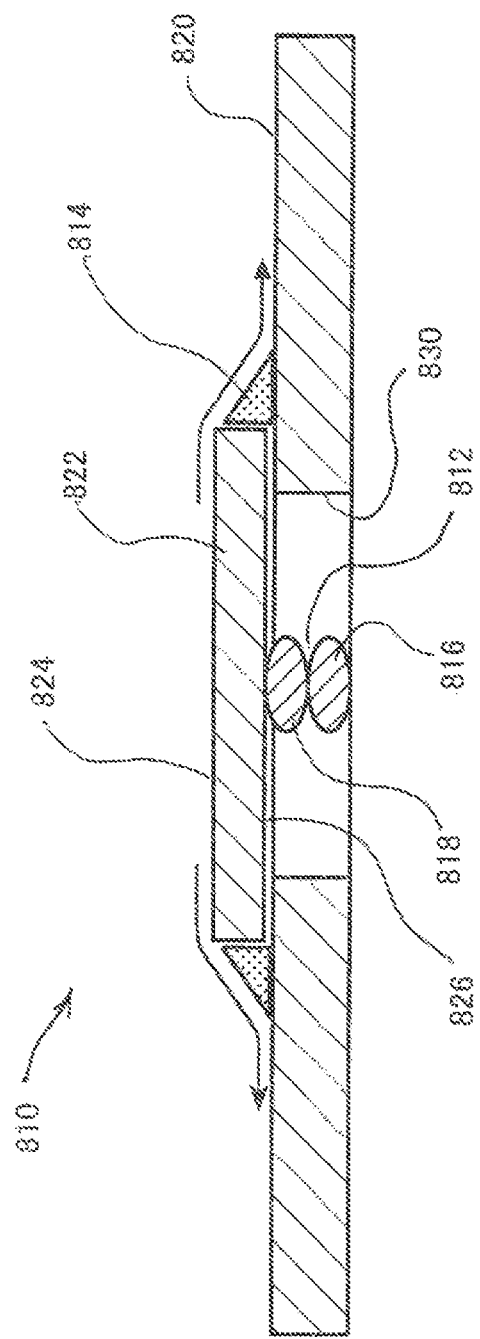
FIG. 10 is a side partial cross-sectional view of the thermocouple portion of a replaceable thermocouple sensor assembly of an eighth embodiment of the present invention.

FIG. 10 is a side partial cross-sectional view of an eighth embodiment of the thermocouple portion of a replaceable thermocouple sensor 810 assembly of the present invention. The sensor 810 includes a thermocouple 812 and a protecting rim 814. The sensor 810 also includes the signal wires 816 and 818 as well as the covering member 820 having a central opening 830. The sensor 810 also includes the contact disk 822 having an upper surface 824 and a lower surface 826. The thermocouple 812 is pressed against and in intimate contact with the lower surface 826 of the contact disk 822. The sensor 810 includes the protecting rim 814 bounding the peripheral rim of the contact disk 822 and sitting on the upper surface of the covering member 820. The protecting rim 814 is formed on the peripheral edge of the contact disk 822 filling the corner which is formed by the peripheral edge of the contact disk 822 and the upper surface of the covering member 820. The protecting rim diverts any liquid solder overflowing from the upper surface 824 of the contact disk 822 outward onto the upper surface of the covering member 820 to protect the thermocouple 812 and signal wires 816 and 818 from the liquid solder and its corrosive effects.

Figure 11:
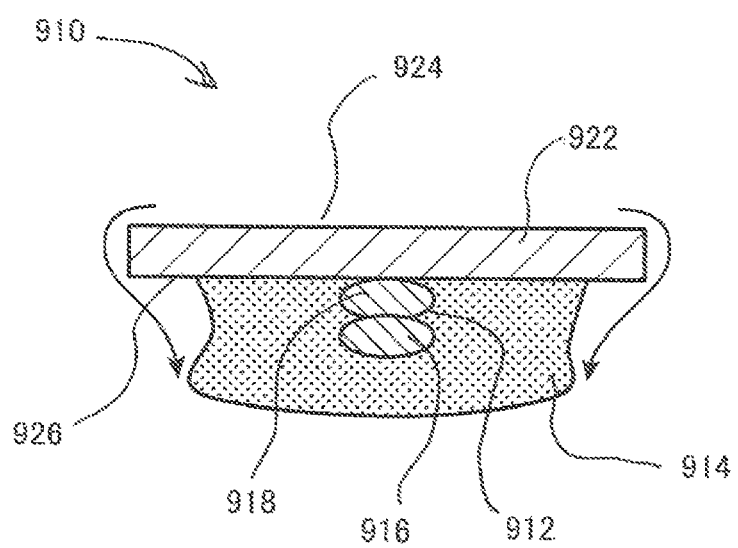
FIG. 11 is a side partial cross-sectional view of the thermocouple portion of a replaceable thermocouple sensor assembly of a ninth embodiment of the present invention.

FIG. 11 is a side partial cross-sectional view of a ninth embodiment of the thermocouple portion of a replaceable thermocouple sensor 910 assembly of the present invention. The sensor 910 includes a thermocouple 912 formed at the intersection of two signal wires 916 and 918. The thermocouple 912 and central portions of the signal wires 916 and 918 are encased in a resin matrix 914. The contact disk 922 having an upper surface 924 and a lower surface 926. The thermocouple 912 is pressed against and in intimate contact with the lower surface 926 of the contact disk 922. The sensor 910 does not include the covering members depicted in the above embodiments. The resin matrix 914 is formed on the lower surface 926 of the contact disk 922. Any liquid solder that spills off of the upper surface 924 of the contact disk 922 flows downward along the peripheral sides of the resin matrix 914. The signal wires 916 and 918 and thermocouple 912 are protected from contacting any liquid solder. Even when the sensor 910 is used alone, the resin matrix 914 protects the signal wires 916 and 918 from corrosion.

Figure 12:
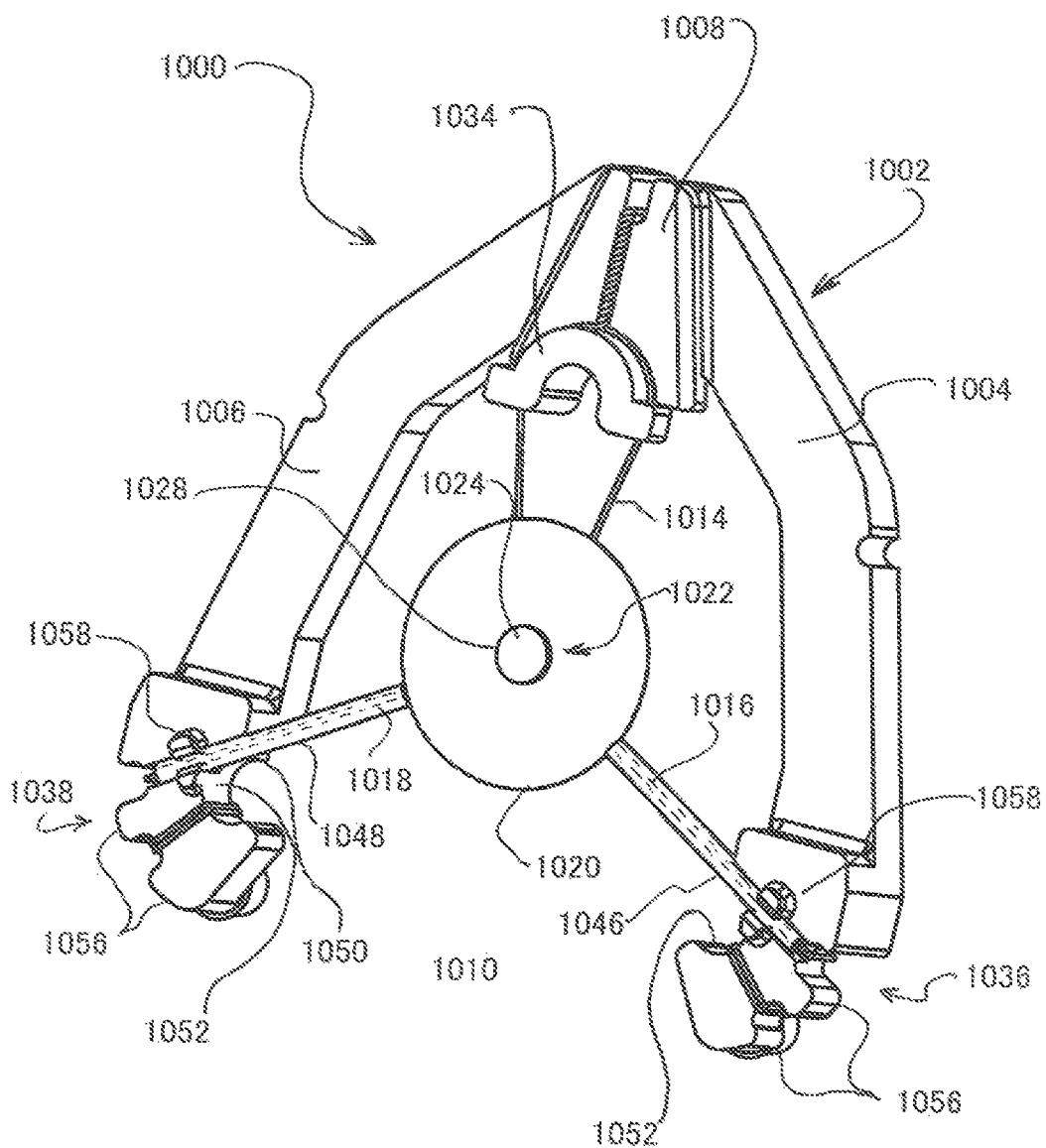
FIG. 12 is a perspective view of a replaceable thermocouple sensor assembly of a tenth embodiment of the present invention.
Figure 13:
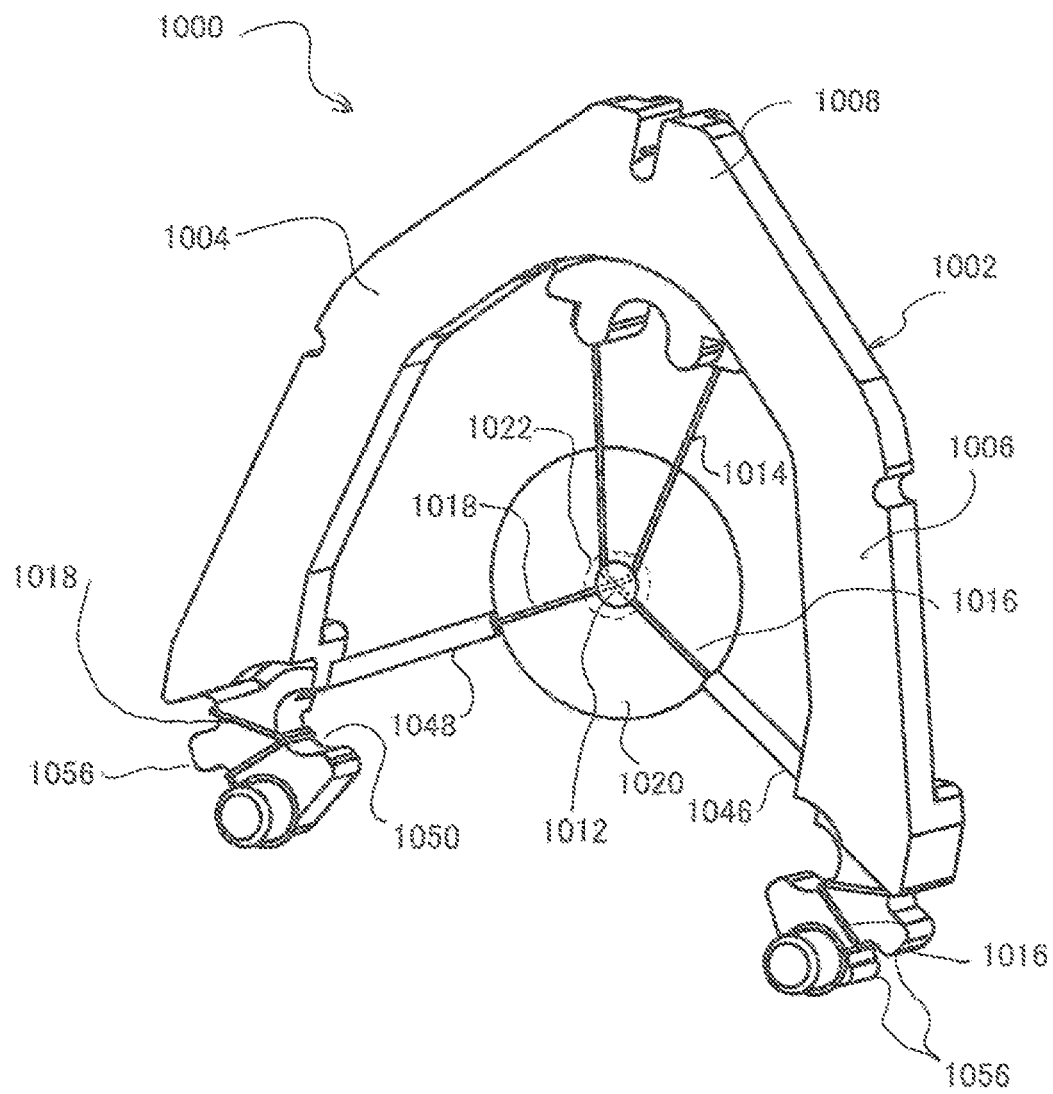
FIG. 13 is a perspective view of the underside of bottom of the replaceable thermocouple sensor assembly of the tenth embodiment of the present invention.
Figure 14:
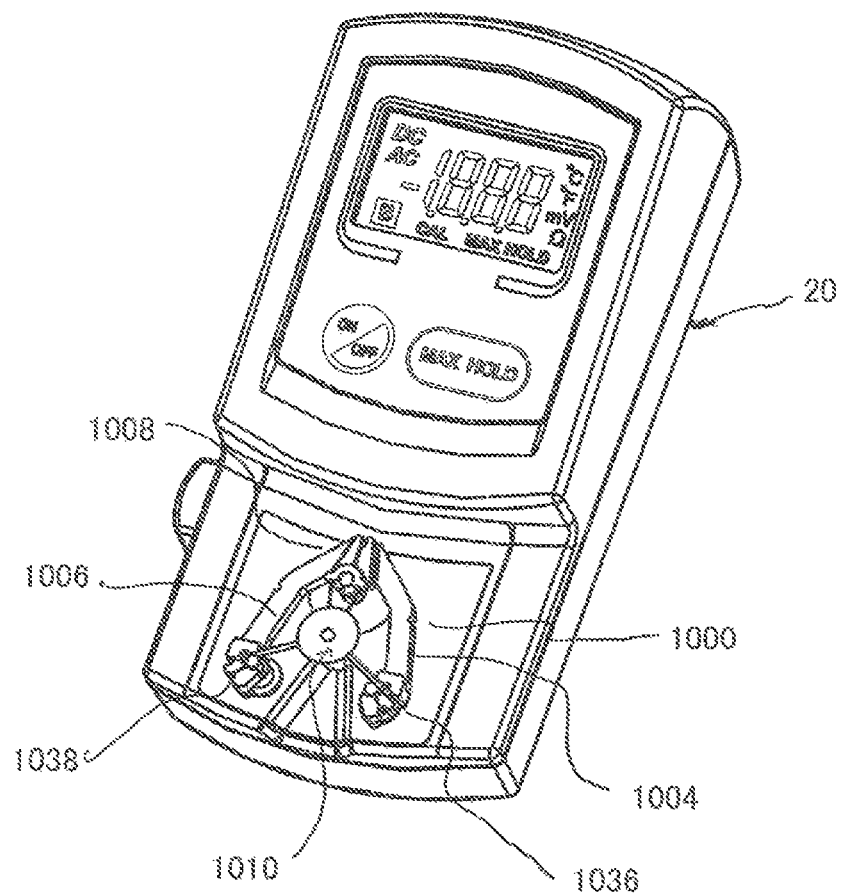
FIG. 14 is a depicts a perspective view of a temperature measuring device having the removable and replaceable thermocouple sensor assembly of the tenth embodiment of the present invention.

FIGS. 12 and 13 depict top and bottom perspective view of a sensor assembly 1000 of a tenth embodiment of the present invention. FIG. 14 is a perspective view of the sensor assembly of FIGS. 12 and 13 mounted on a thermometer 20, identical to the thermometer 20 of FIG. 1 and described above. The sensor assembly 1000 comprises an attaching bracket 1002 having a right arm 1004 and a left arm 1006 extending from a middle part 1008. The attaching bracket 1002 is configured for use with a replaceable sensor, which may have one of the designs described above, or as depicted a sensor 1010 including a thermocouple 1012 formed at the intersection of a pair of signal wires 1016 and 1018 as well as a mounting wire 1014. The sensor 1010 also includes a covering member 1020 and a contact disk 1022. The contact disk 1022 includes an upper surface 1024, a lower surface 1026 and a peripheral rim 1028. The sensor 1010 may also include covering sleeves 1046 and 1048 to cover the signal wires 1016 and 1018, respectively. The functions of the mounting wire 1014, signal wires 1016, 1018, covering member 1020 contact disk 1022, and covering sleeves 1026 and 1028, and the materials from which they are formed, are as described above for similar components.

The attaching bracket 1002 is configured to allow a user to assemble the sensor 1010 into the attaching bracket 1002, and then the user can easily attach the sensor assembly 1000 onto the thermometer 20, as depicted in FIG. 14. The middle part 1008 includes a connecting part 1034 that is sized and shaped to be mounted on the post 34 of the thermometer 20. The connecting part 1034 may have a "C" or "Q" shaped concave surface to easily mount around the post 34 of the thermometer 20. The middle part 1008 may also include a recess to accommodate and secure the peripheral ends of the attaching wire 1014. The middle part 1008 may be designed as a hinge connecting the right arm 1006 to the left arm 1008, allowing limited hinged movement of the respective arms. The right arm 1004 extends from the middle part 1008 to a first connecting assembly 1036 that allows mounting on the post 36 of thermometer 20. The left arm 1006 extends from the middle part 1008 to a second connecting assembly 1038 that allows mounting on the post 38 of thermometer 20.

The first connecting assembly 1036 and second connecting assembly 1038 are symmetrical or mirror images of each other so their components are identified with the same numbers in the figures. With respect to the first connecting assembly 1036, it includes a "C" shaped concave section 1050 defined by an inner surface 1052 of a connecting plate 1054. The radially outer surface of the connecting plate 1054 includes lobes 1056 to allow a user to easily wrap the peripherally outer ends of the respective signal wire 1016 onto and around the connecting plate 1054, whereby uninsulated portions of the signal wire 1016 extend across a portion of the concave section 1050 of inner surface 1052 of the connecting plate 1054 so as to allow electrical connection to the post 36 of the thermometer 20. As explained above, the posts 36 and 38 work as measuring terminals. The thermometer 20 can detect the voltage potential difference between signal wires 1016 and 1018 by touching the mounting posts 26 and 28 to the signal wires 1016 and 1018, respectively.

The top side of the connecting plate 1054 may also include a set of hooks 1058 to secure the signal wire 1016 of the sensor 1010. The hooks 1058 are preferably positioned in order that the signal wire 1016 extending from the hooks 1058 to the center of the covering member 1020 of the sensor 1010 is offset from the center of curvature of the inner concave section 1050 of inner surface 1052 of the connecting plate 1054.

As noted, the second connecting assembly 1038 is symmetrical with the first connecting assembly and has similar features to accommodate the peripheral ends of the signal wire 1016 and mounting on post 38 of thermometer 20. The attaching bracket 1002 is made from hard resin such as phenol. The middle part 1008, first connecting assembly 1036 and second connecting assembly 1038 may also be made of resin or they may be formed from a hard plastic or metal secured to the resin sections of the attaching bracket 1002.

The sensor assembly 1000 may be attached to the measuring device, thermometer 20, by placing the first connecting assembly 1036 and second connecting assembly 1038 and posts 36 and 38 respectively, and then moving the mounting post 34 inward to allow the middle part 1008 to be positioned on the post 34. The spring bias on the post 34 thereby maintains the sensor assembly 1000 in place on the thermometer 20. Because the hooks 1058 are positioned offset from the center of the inner concave section 1050 of inner surface 1052 of the connecting plate 1054, the signal wires 1016 and 1018 do not interfere with mounting the sensor assembly 1000 on the posts 34 and 36 of the thermometer 20, and therefore the attachment to the thermometer 20 does not impose a strong tension on the signal wires 1016 and 1018 that may damage the thermocouple 1012.

When measuring temperature of the thermal tool using the thermometer 20 and sensor assembly 1000 as assembled and depicted in FIG. 14, the thermal tool is pushed against the upper surface 1024 of the contact disk 1022. The contact disk 1022 is thereby subjected to an external force that may be transferred to the thermocouple 1012 and the signal wires 1016 and 1018 to the attaching bracket 1002. In the first embodiment described with respect to FIGS. 1 and 2, the signal wires 116 and 118 are attached to the posts 36 and 38 directly. In that embodiment, the attaching post 34 may be pulled radially inward by tension on the holding wire 114, and the holding wire 114 as well as the signal wires 116 and 118 bend or flex. For the embodiment of FIGS. 12 to 14, the attaching bracket 1002 absorbs the external force applied by the thermal tool. The holding wire 114 as well as the signal wires 116 and 118 do not bend or flex significantly. This assembly prevents the signal wires 116 and 118 from being damaged due to bending deformation, and the thermocouple 1012 at the intersection of the signal wires 116 and 118 is not broken even upon multiple uses over an extended period of time.

The bias spring within the thermometer 20 that biases the position of the post 34 only affects the attaching bracket 1002, and not the signal wires 1016 and 1018. The attaching bracket 1002 is made from hard resin and has high stiffness as compared to the spring force of the bias spring. The attaching bracket 1002 does not deform. Therefore, the tension on the mounting wire 1014 and the signal wires 1016 and 1018 does not change when the bias spring in the thermometer 20 applies a bias force through post 34 on the attaching bracket 1002. The attaching bracket 1002 part protects the signal wires 1016 and 1018 against the bias of the spring in the thermometer 20.

The attaching bracket 1002 also protects the signal wires 1016 and 1018 against other external forces. For example, some users may pull the attaching bracket 1002 when attaching the sensor assembly 1000 to the thermometer 20. The attaching bracket 1002 has a high rigidity so that it does not deform and there is little risk to the sensor 1010 and the signal wires 1016 and 1018 thereof.

Figure 15:
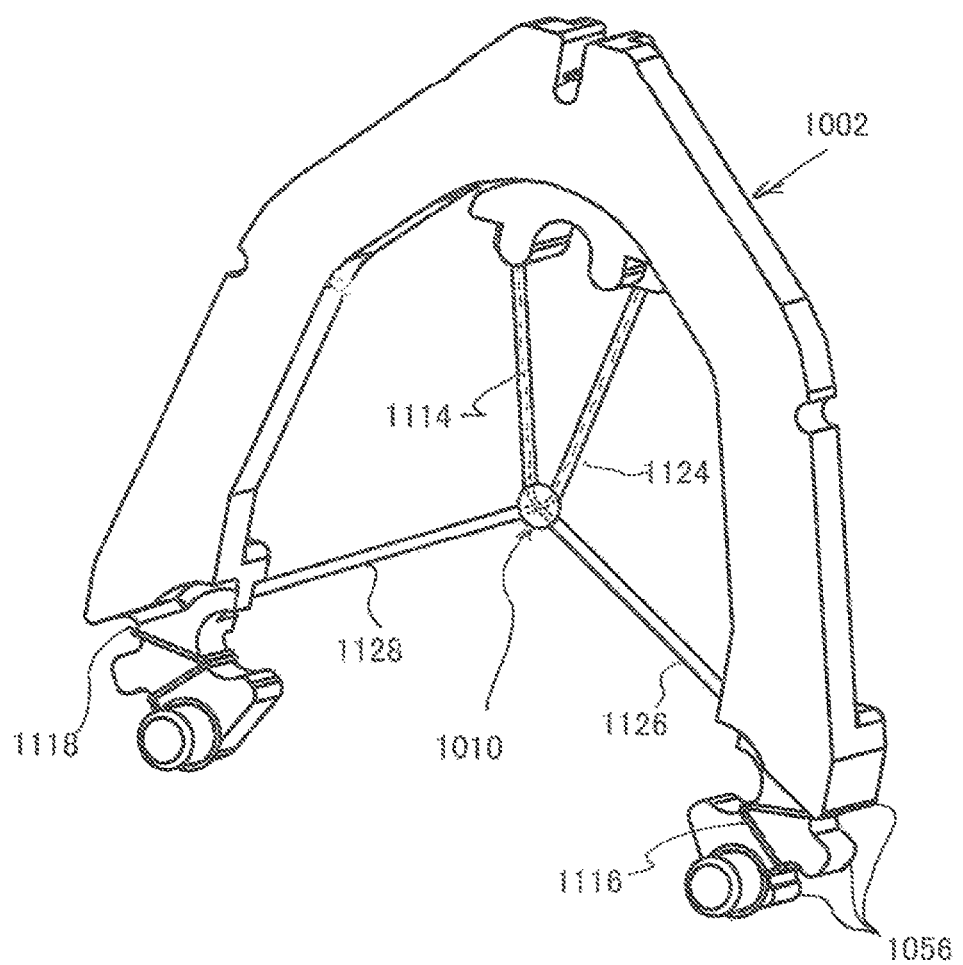
FIG. 15 is a perspective view of a replaceable thermocouple sensor assembly of another embodiment of the present invention.

FIG. 15 is a perspective view of another embodiment of a sensor 1110 mounted on the attaching bracket 1002 described above with respect to FIGS. 12 to 14. The sensor 1110 is similar in design to the sensor 310 of FIG. 5, in that it does not include a disk-shaped covering member protecting the thermocouple and the signal wires. Instead, the sensor 1110 of FIG. 15 has covering sleeves 1124, 1126, 1128, encasing and protection the attaching wire 1114 and signal wires 1116 and 1118. The covering sleeves 1124, 1126, 1128 are made from heat-resisting paint or an insulator tube. The peripheral ends of the signal wires 1116 and 1118 are not encased by the covering sleeves 1126 and 1128 so that they may be attached to the attaching bracket 1002 and provide electrical contact to the posts 36 and 38 of the thermometer 20 as described above. The covering sleeves 1124, 1126, 1128 covers the signal wires 1116 and 1118 to protect them for any liquid solder that may flow off or over a contact disk 1122 of the sensor 1110.

Figure 16:
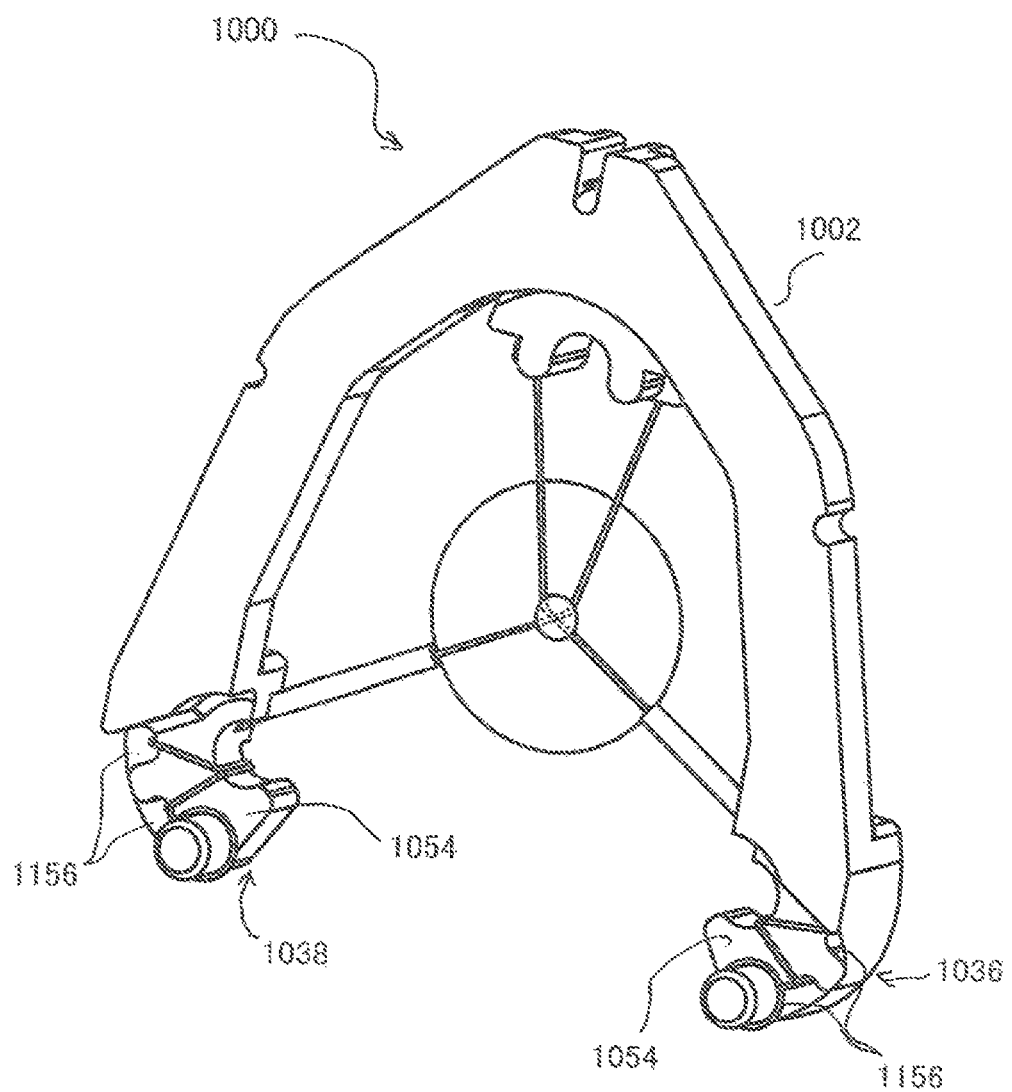
FIG. 16 is a perspective view of a replaceable thermocouple sensor assembly of another embodiment of the present invention.

FIG. 16 is a perspective view of the bottom of an alternative embodiment of the attaching bracket 1002 and a sensor as described above with respect to FIGS. 12 to 14. The attaching bracket 1002 of FIG. 16 differs from that of FIGS. 12 to 14 only in that as opposed to the lobes 1056 described above, the attaching bracket 1002 of FIG. 16 includes positioning holes 1156 on the radially outed portions of the first connecting assembly 1036 and second connecting assembly 1038. The positioning holes 1156 are provided to allow threading of the ends of the signal wires 1016 and 1018 of the sensor 1010 to encircle the connecting plates 1054 and position sections of the signal wires 1016 and 1018 across the concave sections 1050 of the inner surfaces 1052 of the connecting plates 1054. Thus, the signal wires 1016 and 1018 pass through the positioning holes and wind around the connecting plates 1054.

Figure 17:
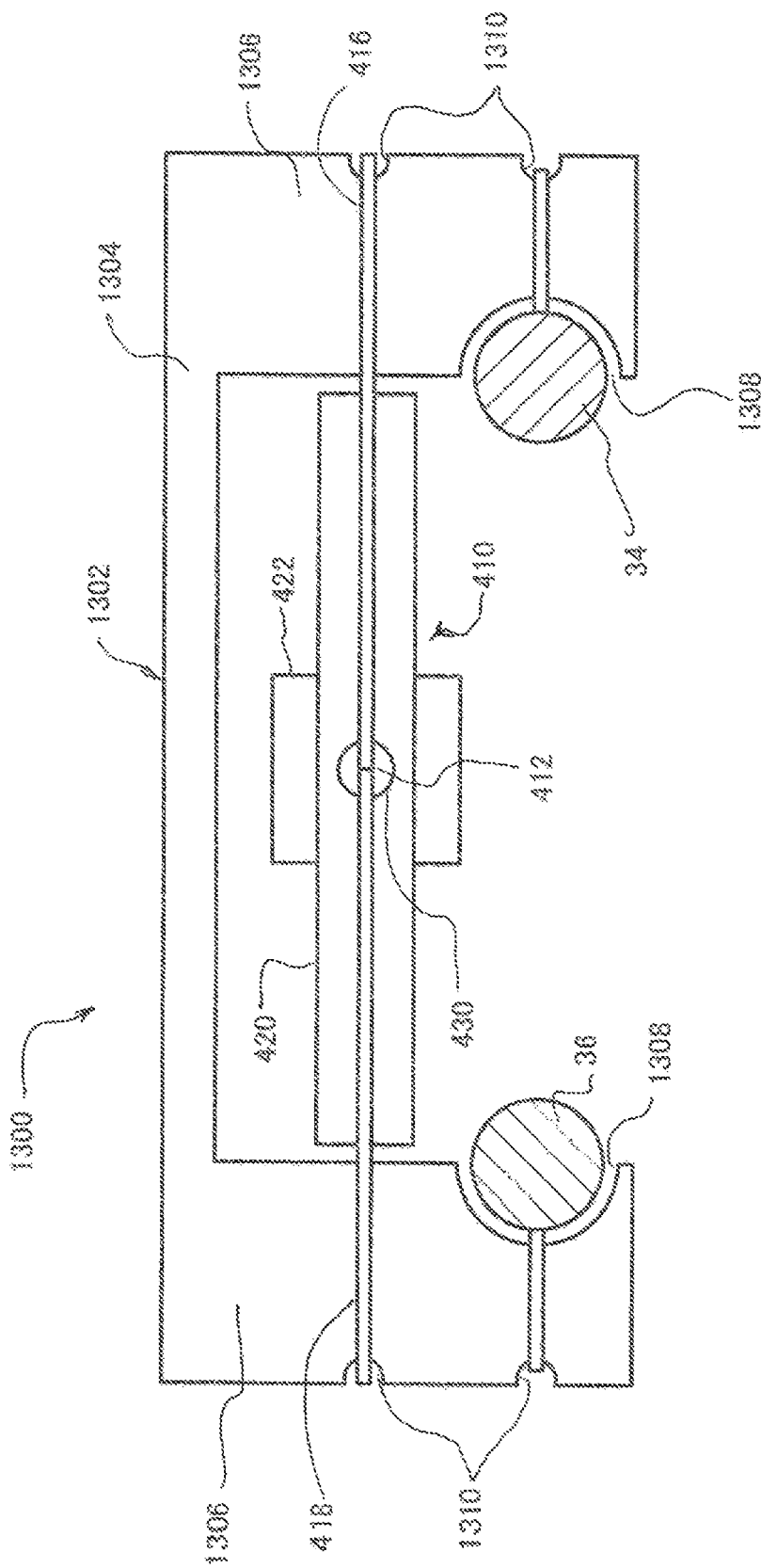
FIG. 17 is a bottom view of a replaceable thermocouple sensor assembly of another embodiment of the present invention.

FIG. 17 is a bottom view of another alternative configuration of a sensor assembly 1300. The sensor assembly 1300 includes a bracket 1302 that mounts the sensor 410 of FIG. 6 on the thermometer 20, without including an attaching wire and attachment to the post 34 of the thermometer 20. The bracket 1302 includes a connecting bar 1304 having attachment flanges 1306 on opposite ends of the connecting bar 1304. Each of the attachment flanges 1306 includes a "C" shaped concave recess 1308 sized to fit over the post 34 or 36 of the thermometer 20. The attachment flanges 1306 also include channels 1310 into which the peripheral ends of the sensor 410 signal wires 416 and 418 are inserted so as to wrap around the attachment flanges 1306, with a portion of the signal wires 416 and 418 traversing the concave recesses 1308 of the attachment flanges so that the signal wires contact the posts 34 and 36 of the thermometer 20 when the sensor assembly 300 is mounted on the thermometer 20. As described above the sensor 410 has a thermocouple 412 and a covering member 420 having a central opening 430. The thermocouple 412 is at the intersection of two conductor signal wires 416 and 418. The sensor 410 includes a contact plate 422. The contact plate 422 is depicted as having a square shape although the contact plate 422 may preferably be rectangular. The contact plate 422 completely covers central opening 430 of the covering member 420, and extends over the portion of the covering member 420 surrounding the central opening 430. The conductor signal wires 416 and 418 in this embodiment are single wires depicted extending in a straight line, although the wires are bendable. The signal wires 416 and 418 of the sensor 410 of FIG. 17 have peripheral ends that wrap around The bracket 1302 of the sensor assembly 1300 positions the sensor 410 above the posts 36 and 38 of the thermometer 20, and allows easy mounting of the sensor assembly across the posts 36 and 38. Alternatively, one or both of the posts 36 and 38 may be resiliently mounted to allow slight motion inward and biased outward to allow easier assembly of the bracket 1302 on the thermometer 20. The bracket 1302 is preferably formed from a resin such as phenol, or a high temperature plastic or thermoplastic material so as to be very rigid, thereby preventing tensile forces being applied to the signal wires 416 and 418 during installation and use.

The invention has been described in detail above in connection with the figures, and it will be understood that various combinations of shapes for the sensors, contact disks and cover member may have alternate configurations to those depicted and described, yet still provide the same functionality. Also, in all of the embodiments of the sensors, one of the signal wires is preferably Alumel and the other is preferably Chromel, however other conductor materials appropriate to form an accurate high temperature thermocouple may be used. Those skilled in the art will appreciate that the foregoing disclosure is meant to be exemplary and specification and the figures are provided to explain the present invention, without intending to limit the potential modes of carrying out the present invention. The scope of the invention is defined only by the appended claims and equivalents thereto.

The invention claimed is:

1. A sensor for use with a temperature measuring device, the sensor comprising:
   a pair of signal wires formed of different electrically conducting materials intersecting to form a thermocouple;
   a covering member formed from a sheet of non-electrically conductive material covering portions of said pair of signal wires;
   a contact disk formed from a sheet of heat conducting material, said contact disk partially covering said covering member and said contact disk having a surface contacting said thermocouple; and
   a protecting member formed from a resin, non-conductive heat-resisting paint, high temperature thermoplastic, ceramic or non-electrically conductive metal seals said thermocouple, wherein said protecting member is sealed between the sheet of said covering member and the sheet of said contact disk.

2. A sensor for use with a temperature measuring device, the sensor comprising:
   a pair of signal wires formed of different electrically conducting materials intersecting to form a thermocouple;
   a covering member of non-electrically conductive material covering portions of said pair of signal wires;
   a contact disk formed from a heat conducting material, said contact disk partially covering said covering member and said contact disk having a surface contacting said thermocouple; and
   a protecting member formed from a resin, non-conductive heat-resisting paint, high temperature thermoplastic, ceramic or non-conductive metal seals said thermocouple, wherein said protecting member is a ring formed on a peripheral edge of said contact disk, said ring filling a corner which is defined by said peripheral edge of said contact disk and an upper surface of said covering member.

3. The sensor of claim 2, wherein said protecting member covers the signal wires under said contact disk and an underside of said thermocouple.

4. A sensor for use with a temperature measuring device, the sensor comprising:
- a first signal wire formed from a first electrical conducting material;
- a second signal wire formed from a second different conducting material;
- a thermocouple formed at the intersection of said first signal wire and said second signal wire;
- a covering member formed from a sheet of high temperature resistant non-electrically conductive material, said covering member having an opening positioned above said thermocouple;
- a contact member positioned above and overlapping said opening of said covering member, said contact member having lower surface contacting said thermocouple; and
- an attaching bracket having a right arm and a left arm extending from a middle part, said right and left arms including connecting assemblies to secure respective ends of said first signal wire and second signal wire.

5. The sensor of claim 4 wherein said first signal wire and said second signal wire extend away from said thermocouple in opposite directions and said first signal wire and said second signal wire of exposed ends to electrically connect to terminals of a temperature measuring device.

6. The sensor of claim 4, further comprising a protecting member ring sealed between said covering member and said contact member.

7. A sensor assembly for use with a temperature measuring device, the sensor assembly comprising:
- a first signal wire formed from a first conducting material
- a second signal wire formed from a second conducting material;
- a thermocouple formed at an intersection of said first and second signal wires;
- a covering member formed from a sheet of high temperature resistant non-electrically conductive material having a circular, triangle, square, polygon or ellipse shape and a central opening, said covering member covering at least portions of said first and second signal wires;
- a contact disk formed from a thin sheet of copper or iron having a circular, triangle, square, polygon or ellipse shape, said contact disk partially covering said covering member and said contact disk having a surface contacting said thermocouple; and
- an attaching bracket having a right arm and a left arm extending from a middle part, said right and left arms including connecting assemblies to secure respective ends of said first signal wire and second signal wire.

8. The sensor assembly of claim 7 further comprising:
means for mounting said first signal wire and said second signal wire onto terminals of said temperature measuring device.

* * * * *